(12) United States Patent
Kuo

(10) Patent No.: US 12,237,361 B2
(45) Date of Patent: Feb. 25, 2025

(54) TRANSPARENT DISPLAY

(71) Applicant: Au Optronics Corporation, Hsinchu (TW)

(72) Inventor: Chih-Che Kuo, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 456 days.

(21) Appl. No.: 17/376,180

(22) Filed: Jul. 15, 2021

(65) Prior Publication Data
US 2022/0115436 A1 Apr. 14, 2022

Related U.S. Application Data

(60) Provisional application No. 63/090,330, filed on Oct. 12, 2020.

(30) Foreign Application Priority Data

Mar. 15, 2021 (TW) ................. 110109121

(51) Int. Cl.
H01L 33/48 (2010.01)
B60K 35/00 (2006.01)
H01L 27/15 (2006.01)
H01L 33/38 (2010.01)
H01L 33/42 (2010.01)
H01L 33/58 (2010.01)
(Continued)

(52) U.S. Cl.
CPC ............ *H01L 27/156* (2013.01); *B60K 35/00* (2013.01); *H01L 33/387* (2013.01); *H01L 33/42* (2013.01); *H01L 33/483* (2013.01); *H01L 33/58* (2013.01); *B60K 35/22* (2024.01); *B60K 35/60* (2024.01); *B60K 2360/785* (2024.01)

(58) Field of Classification Search
CPC ...... B60K 2370/152; B60K 2370/1523; B60K 2370/166; B60K 2370/193; B60K 2370/785; B60K 2370/797; B60K 35/00; H01L 25/0753; H01L 25/167; H01L 27/156; H01L 33/387; H01L 33/42; H01L 33/483; H01L 33/58
See application file for complete search history.

(56) References Cited

U.S. PATENT DOCUMENTS 7,477,140 B1    1/2009  Booth et al.
7,659,808 B1 *  2/2010  Cooper ................... B60Q 1/50
                                                        340/471
(Continued)

FOREIGN PATENT DOCUMENTS

CN    101557533    10/2009
CN    208872957    5/2019
(Continued)

*Primary Examiner* — Matthew C Landau
*Assistant Examiner* — Dmitriy Yemelyanov
(74) *Attorney, Agent, or Firm* — JCIPRNET

(57) ABSTRACT

A transparent display includes a first transparent substrate, pixel structures, first electrodes, and second electrodes. The pixel structures are located on the first transparent substrate. Each pixel structure includes light-emitting elements. A pitch of adjacent light emitting elements in each pixel structure is 0.17 mm to 0.34 mm. A pitch of adjacent pixel structures is 3.4 mm to 15.4 mm. The first electrodes and the second electrodes are electrically connected to the pixel structures.

20 Claims, 13 Drawing Sheets

(51) Int. Cl.
  *B60K 35/22*  (2024.01)
  *B60K 35/60*  (2024.01)

(56) References Cited

U.S. PATENT DOCUMENTS

| | | |
|---|---|---|
| 11,133,294 B2 | 9/2021 | Chen et al. |
| 2009/0236971 A1 | 9/2009 | Kuo et al. |
| 2020/0058625 A1 | 2/2020 | Chen et al. |
| 2020/0350361 A1 | 11/2020 | Tao et al. |
| 2021/0183943 A1* | 6/2021 | Mori .................. H01L 25/0753 |
| 2021/0367104 A1* | 11/2021 | Yun ...................... H01L 25/167 |

FOREIGN PATENT DOCUMENTS

| | | | | |
|---|---|---|---|---|
| CN | 209395690 | | 9/2019 | |
| CN | 111630584 | | 9/2020 | |
| DE | 202011105445 | U1 * | 2/2012 | ............ B60Q 9/008 |
| TW | 200941427 | | 10/2009 | |
| TW | 202010118 | | 3/2020 | |
| WO | WO-2020050062 | A1 * | 3/2020 | ................ B60J 1/02 |

* cited by examiner

TRANSPARENT DISPLAY

CROSS-REFERENCE TO RELATED APPLICATION

This application claims the priority benefit of U.S. provisional application Ser. No. 63/090,330, filed on Oct. 12, 2020 and Taiwan application serial no. 110109121 filed on Mar. 15, 2021. The entirety of the above-mentioned patent applications are hereby incorporated by reference herein and made a part of this specification.

BACKGROUND

Field of the Disclosure

The invention is related to a transparent display, and more particularly to a transparent display suitable for a rear windshield of a transportation device.

Description of Related Art

In some existing transportation devices, such as buses, taxis, and so on, a display is often disposed on the rear windshield to display driving information (for example, "turning", "reversing", "turning left", "turning right" and other information) to the driver of the following vehicle. However, if a general display is used to be disposed on the rear windshield of the vehicle in front, the general display will obstruct the rear view of the driver of the vehicle in front. As a result, the driver of the vehicle in front cannot see or cannot see clearly the traffic situation behind, which seriously affects the driving safety.

SUMMARY

The invention provides a transparent display, which can improve the problem that the display device obstructs the view of the driver.

The invention provides a transparent display for a rear windshield of a transportation device, which can improve the problem that the display device on the rear windshield obstructs the view of the driver of the transportation device.

At least one embodiment of the invention provides a transparent display. The transparent display includes a first transparent substrate, a plurality of pixel structures, a plurality of first electrodes, and a plurality of second electrodes. The plurality of pixel structures are located on the first transparent substrate. Each of the plurality of pixel structures includes a plurality of light-emitting elements. A pitch between adjacent light-emitting elements in each of the plurality of pixel structure is 0.17 mm to 0.34 mm. A pitch between adjacent pixel structures is 3.4 mm to 15.4 mm. The first electrodes and the second electrodes are electrically connected to the plurality of pixel structures.

At least one embodiment of the invention provides a transparent display suitable for a rear windshield of a transportation device including a first transparent substrate, a plurality of pixel structures, a plurality of first electrodes, and a plurality of second electrodes. The pixel structures are located on the first transparent substrate. Each of the plurality of pixel structures includes a plurality of light-emitting elements. The pitch between adjacent light-emitting elements in each of the plurality of pixel structures is 0.17 mm to 0.34 mm. The pitch between adjacent pixel structures is 3.4 mm to 15.4 mm. The plurality of first electrodes and the plurality of second electrodes are electrically connected to the plurality of pixel structures. A sum of a sight distance between a first driver and an interior rearview mirror in a front vehicle and a distance between the interior rearview mirror and the first transparent substrate is about 2 meters to 3 meters. A sight distance between the first transparent substrate and a second driver of the rear vehicle is about 20 meters to 90 meters.

DESCRIPTION OF THE EMBODIMENTS

Figure 1:
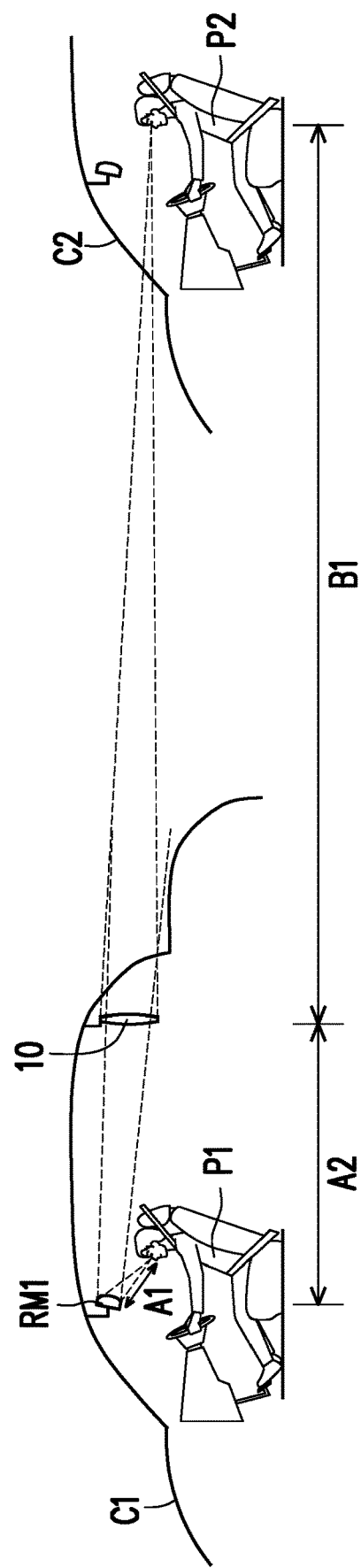
FIG. 1 is a schematic cross-sectional view of a transparent display disposed in a transportation device according to an embodiment of the present invention.
Figure 2A:
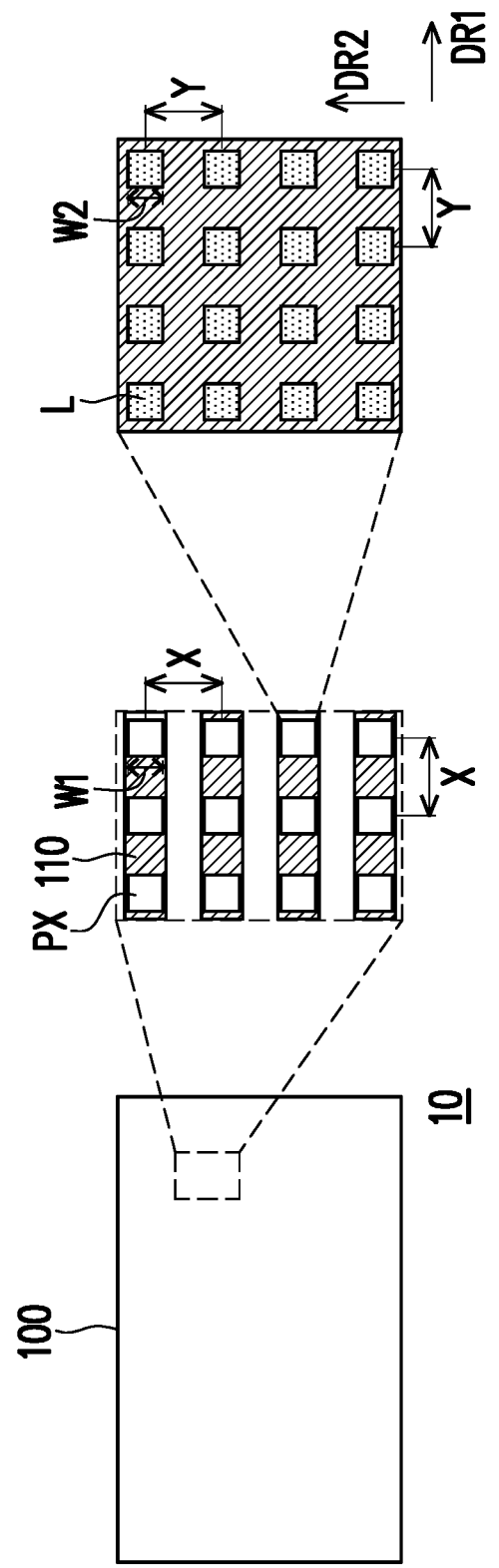
FIG. 2A is a schematic top view of a transparent display according to an embodiment of the invention.
Figure 2B:
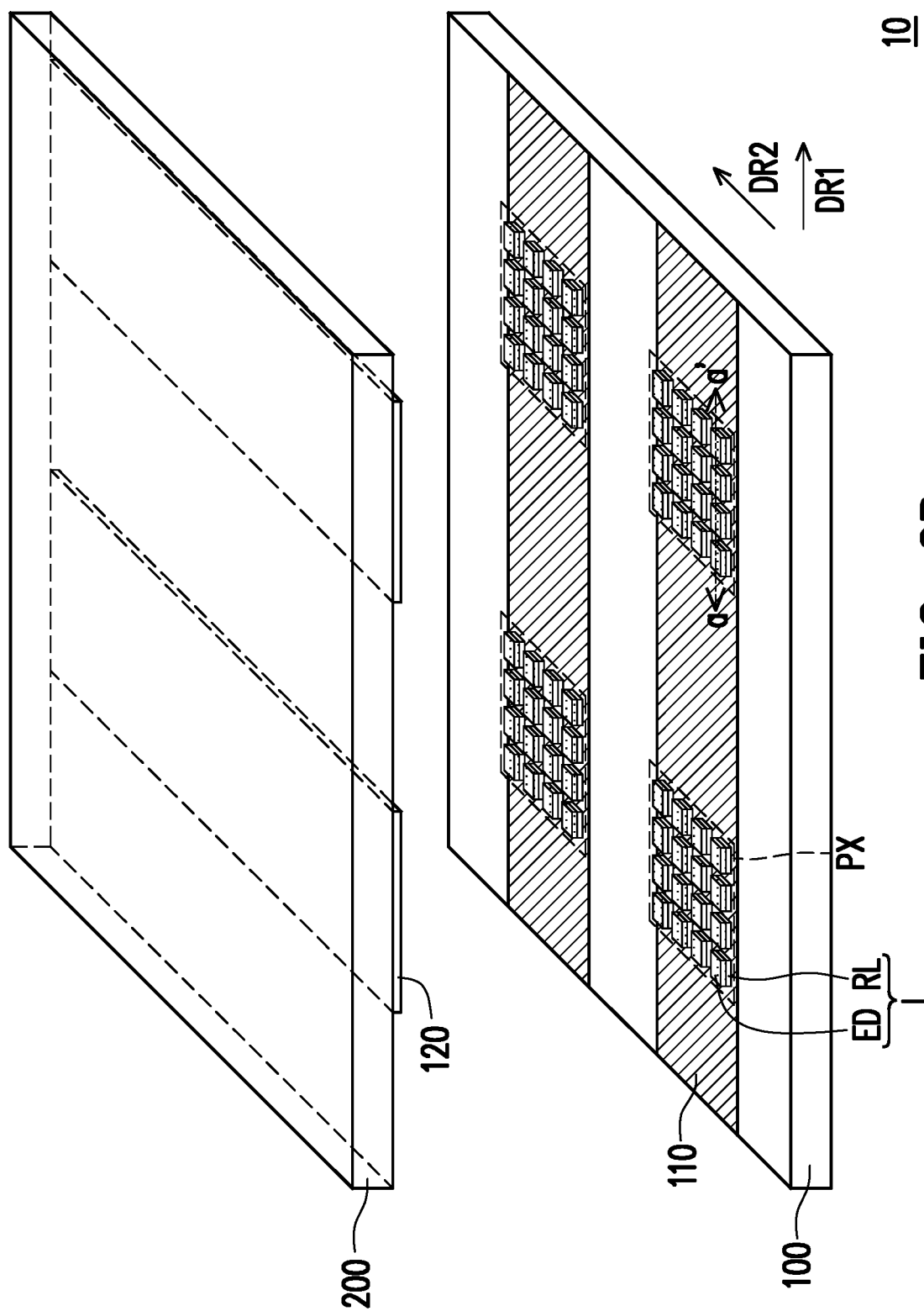
FIG. 2B is a three-dimensional schematic diagram of a transparent display according to an embodiment of the present invention.
Figure 2C:
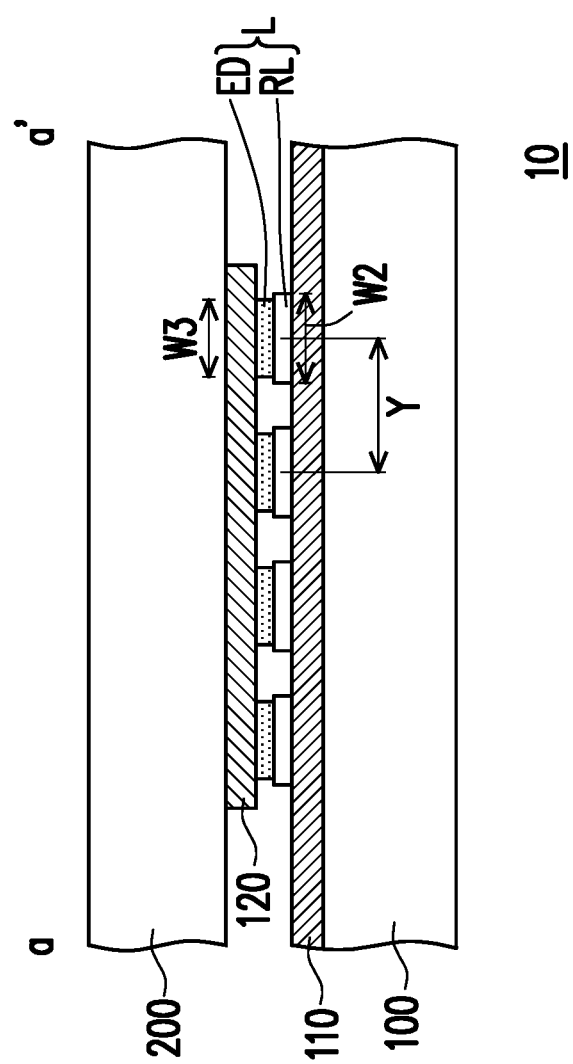
FIG. 2C is a schematic cross-sectional view of a transparent display according to an embodiment of the invention.

FIG. 1 is a schematic cross-sectional view of a transparent display disposed on a transportation device according to an embodiment of the present invention. FIG. 2A is a schematic top view of the transparent display according to an embodiment of the present invention, wherein the second electrodes are omitted in FIG. 2A. FIG. 2B is a three-dimensional exploded schematic diagram of the transparent display according to an embodiment of the present invention, wherein FIG. 2B only illustrates a partial area of the transparent display. FIG. 2C is a schematic cross-sectional view of the transparent display according to an embodiment of the present invention, wherein FIG. 2C corresponds to the position of the line a-a' in FIG. 2B.

Referring to FIG. 1, in this embodiment, two transportation devices travel one after another. For example, the rear vehicle C2 is driven behind the front vehicle C1. The front vehicle C1 and the rear vehicle C2 can be any type of transportation device, such as a bus, a taxi, a general sedan, a van, etc.

The transparent display 10 is, for example, disposed on the rear windshield of the front vehicle C1. The sum of the sight distance A1 between the first driver P1 and the interior rearview mirror RM1 in the front vehicle C1 and the distance A2 between the interior rearview mirror RM1 and the transparent display 10 is about 2 meters to 3 meters. The sight distance B1 between the transparent display 10 and the second driver P2 of the rear vehicle C2 is about 20 meters to 90 meters.

Referring to FIGS. 2A to 2C, the transparent display 10 includes a first transparent substrate 100, a plurality of pixel structures PX, a plurality of first electrodes 110, and a plurality of second electrodes 120. In this embodiment, the transparent display 10 further includes a second transparent substrate 200. The second transparent substrate 200 is disposed opposite to the first transparent substrate 100.

The pixel structures PX are located on the first transparent substrate 100. In this embodiment, the pixel structures PX are arrayed on the first transparent substrate 100. For example, the pixel structures PX are arranged along a first direction DR1 and a second direction DR2.

Figure 3:
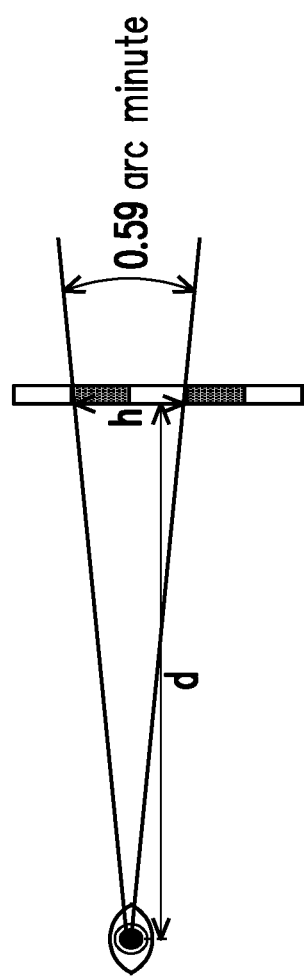
FIG. 3 is a schematic diagram of a sight distance and the shortest distance between two points that can be distinguished by human eyes according to an embodiment of the present invention.

The sight distance d (or visual distance) and the shortest distance h between two points that can be distinguished by human eye can be calculated according to the following formula 1, as shown in FIG. 3.

$$h = 2d \cdot \tan\left(\frac{1}{2} \cdot \frac{0.59}{60}\right) \quad \text{Formula 1}$$

Referring to FIGS. 1 and 2A, the sight distance B1 between the first transparent substrate 100 and the second driver P2 of the rear vehicle C2 is about 20 meters to 90 meters. When the distance B1 is 20 meters to 90 meters, it can be calculated from formula 1 that the shortest distance between the two points on the transparent display 10 that the second driver P2 can distinguish is about 3.4 mm to 15.4 mm. Based on this, in this embodiment, a pitch X between adjacent pixel structures PX is 3.4 mm to 15.4 mm, so that the second driver P2 can recognize the information image displayed by the pixel structures PX. In this embodiment, the pitch X between adjacent pixel structures PX is defined as a distance between center points of two adjacent pixel structures PX (including pixel structures PX adjacent in the first direction DR1 and pixel structures PX adjacent in the second direction DR2). In this embodiment, the width W1 (including the width in the first direction DR1 and the width in the second direction DR2) of each pixel structure PX is half of the pitch X, that is, the width W1 is 1.7 mm to 7.7 mm. In some embodiments, in order to improve the visual recognition of the second driver P2, the width W1 of each pixel structure PX is equal to or greater than half of the pitch X, but the width W1 does no greater than the pitch X. In this embodiment, the width of each pixel structure PX in the first direction DR1 and the width of each pixel structure PX in the second direction DR2 are the same, but the invention is not limited thereto. In other alternately embodiments, the width of each structure PX in the first direction DR1 and the width of each pixel structure PX in the second direction DR2 are different.

Continue to refer to FIGS. 1 and 2A, the sum of the sight distance A1 between the first driver P1 and the interior rearview mirror RM1 of the front vehicle C1 and the distance A2 between the interior rearview mirror RM1 and the first transparent substrate 100 of the transparent device 10 is about 2 meters to 3 meters. When the sum of the sight distance A1 and the distance A2 is 2 meters to 3 meters, it can be calculated by formula 1 that the shortest distance between the two points on the transparent display 10 that the first driver P1 can distinguish is about 0.34 mm to 0.51 mm. In other words, the first driver P1 cannot distinguish two points on the transparent display 10 with a pitch of less than 0.34 mm. Based on this, in this embodiment, each pixel structure PX includes a plurality of light-emitting elements L, and the pitch Y between adjacent light-emitting elements L in each pixel structure PX is less than 0.34 mm, so that the first driver P1 cannot recognize the information image displayed by the pixel structures PX, and the pixel structures PX will not obstruct the view of the first driver P1. In this embodiment, in order to make the light-emitting element L have a sufficient size and light-emitting area, the pitch Y between adjacent light-emitting elements L is greater than 0.17 mm. Based on the foregoing, the pitch Y between the light-emitting elements L in this embodiment is 0.17 mm to 0.34 mm.

In this embodiment, the pitch Y between adjacent light-emitting elements L is defined as a distance (or gap) between center points of two adjacent light-emitting elements L (including the light-emitting elements L adjacent in the first direction DR1 and the light-emitting elements L adjacent in the second direction DR2). In this embodiment, the pitch between adjacent light-emitting elements L in the first direction DR1 and the distance between the center points of each of the adjacent light-emitting elements L in the second direction DR2 are the same, but the invention is not limited thereto. In other alternately embodiments, the pitch between adjacent light-emitting elements L in the first direction DR1 and the distance between the center points of each of the adjacent light-emitting elements L in the second direction DR2 are different. In this embodiment, the width W2 (including the width in the first direction DR1 and the width in the second direction DR2) of each light-emitting element L is half of the pitch Y. That is, the width W2 is 0.085 mm to 0.17 mm. In some embodiments, in order not to affect the view of the first driver P1, the width W2 of each light emitting element L is equal to or less than half of the pitch Y, but the width W2 is not less than one quarter of the pitch Y, so as not to affect the display brightness.

The shapes of the vertical projection of the light emitting elements L on the first transparent substrate 100 are circles, rectangles, hexagons or other geometric shapes.

Referring to FIGS. 2A, 2B and 2C, in this embodiment, the first electrodes 110 are formed on the first transparent substrate 100, and the second electrodes 120 are formed on the second transparent substrate 200. The material of the first electrodes 110 and the second electrodes 120 includes transparent conductive materials. The first electrodes 110 and the second electrodes 120 are electrically connected to the pixel structures PX. The first electrodes 110 and/or the second electrodes 120 are formed between the first transparent substrate 100 and the second transparent substrate 200, but the invention is not limited thereto.

In this embodiment, the first electrodes 110 extend along the first direction DR1, and the second electrodes 120 extend along the second direction DR2. The pixel structures PX are arranged in a rectangular array, and the light-emitting elements L of the pixel structures PX located in the same column (located along the first direction DR1) are electrically connected to the same first electrode 110, and the light-emitting elements L of the pixel structures PX located in the same row (located along the second direction DR2) are electrically connected to the same the second electrode 120.

In this embodiment, referring to FIG. 2C, each light-emitting element L includes a light-shielding layer RL and a self-luminous light-emitting element ED. In this embodiment, the width W2 and the pitch Y of the light-emitting elements L are defined by the light-shielding layer RL, and the width W2 and the pitch Y of the light-emitting elements L are the width W2 and the pitch Y of the light-shielding layers RL. The pitch Y between adjacent light-shielding layers RL is 0.17 mm to 0.34 mm, and the width W2 of the light-shielding layer RL is half of the pitch Y of the adjacent light-shielding layers RL, that is, 0.085 to 0.17 mm. In this embodiment, since the pitch Y of the adjacent light-shielding layers RL is 0.17 mm to 0.34 mm, the influence of the light-shielding layers RL on the view of the first driver P1 can be prevented. In some embodiments, the light-shielding layers RL include a light-reflecting material, such as aluminum, silver, titanium, molybdenum, etc. or a composite material thereof. The light shielding layers RL can prevent the information image (or light displayed by the self-luminous light-emitting elements ED) from affecting the first driver P1.

The self-luminous light-emitting elements ED are disposed on the light-shielding layers RL. The width W3 of the self-luminous light-emitting elements ED may be equal to or smaller than the width W2 of the light shielding layers RL. The pitch Y of the self-luminous light emitting elements ED is equal to the pitch Y of the light shielding layers RL. In this embodiment, the self-luminous light-emitting elements ED are, for example, organic light-emitting diodes, inorganic light-emitting diodes (such as mini LEDs or micro LEDs), or other electroluminescent elements. The light shielding layers RL are closer to the first driver P1 than the self-luminous light-emitting elements ED, thereby preventing the light emitted by the self-luminous light-emitting element ED from affecting the view of the first driver P1.

Figure 4:
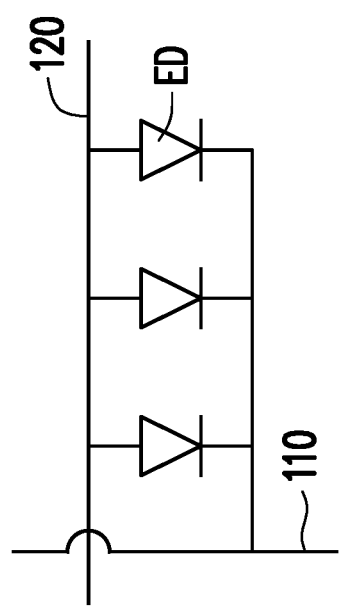
FIG. 4 is a circuit diagram corresponding to a self-luminous light-emitting element according to an embodiment of the present invention.

In this embodiment, the circuit diagram corresponding to each self-luminous light-emitting element ED is illustrated in FIG. 4, the number of the self-luminous light-emitting elements ED in FIG. 4 is only for illustration. In this embodiment, a single pixel structure PX includes three light-emitting elements ED as an example. In this embodiment, the transparent display 10 is a passively driven display. For example, the cathodes of the plurality of self-luminous light-emitting elements ED in each pixel structure PX are directly connected to the same first electrode 110, and the anodes of the plurality of self-luminous light-emitting elements ED in each pixel structure PX are directly connected to the same second electrode 120. In other embodiments, the anodes of the plurality of self-luminous light-emitting elements ED in each pixel structure PX are directly connected to the same first electrode 110, and the cathodes of the plurality of self-luminous light-emitting elements in each pixel structure PX are directly connected to the same second electrode 120. In this embodiment, a single pixel structure PX includes a plurality of self-luminous light-emitting elements ED connected in parallel, but the invention is not limited thereto. In other embodiments, a single pixel structure PX includes a plurality of self-luminous light-emitting elements ED connected in series (or part of the self-luminous light-emitting elements ED are connected in series and another part of the self-luminous light-emitting elements ED are connected in parallel).

In this embodiment, the plurality of self-luminous light-emitting elements ED in each pixel structure PX can be turned on together and turned off together. The self-luminous light-emitting elements ED in each pixel structure PX can emit light of the same color or different colors, depending on the materials of the self-luminous light-emitting elements ED. In some embodiments, the color of the light emitted by the pixel structure PX can be adjusted according to needs. For example, the transparent display 10 includes a pixel structure PX that can emit red light (i.e., a red sub-pixel), a pixel structure PX that can emit green light (i.e., a green sub-pixel), and a pixel structure PX that can emit blue light (i.e., blue sub-pixel). The plurality of pixel structures PX emitting light of different colors together form a color image. In some embodiments, one of the cathodes and the anodes of the pixel structures PX of different colors may be connected to each other, and another of the cathodes and the anodes are respectively electrically connected to different signal lines. The number of the light-emitting elements ED in FIG. 4 is only for illustration, and the present invention does not limit the number of light-emitting elements ED of a single pixel structure PX.

Figure 5:
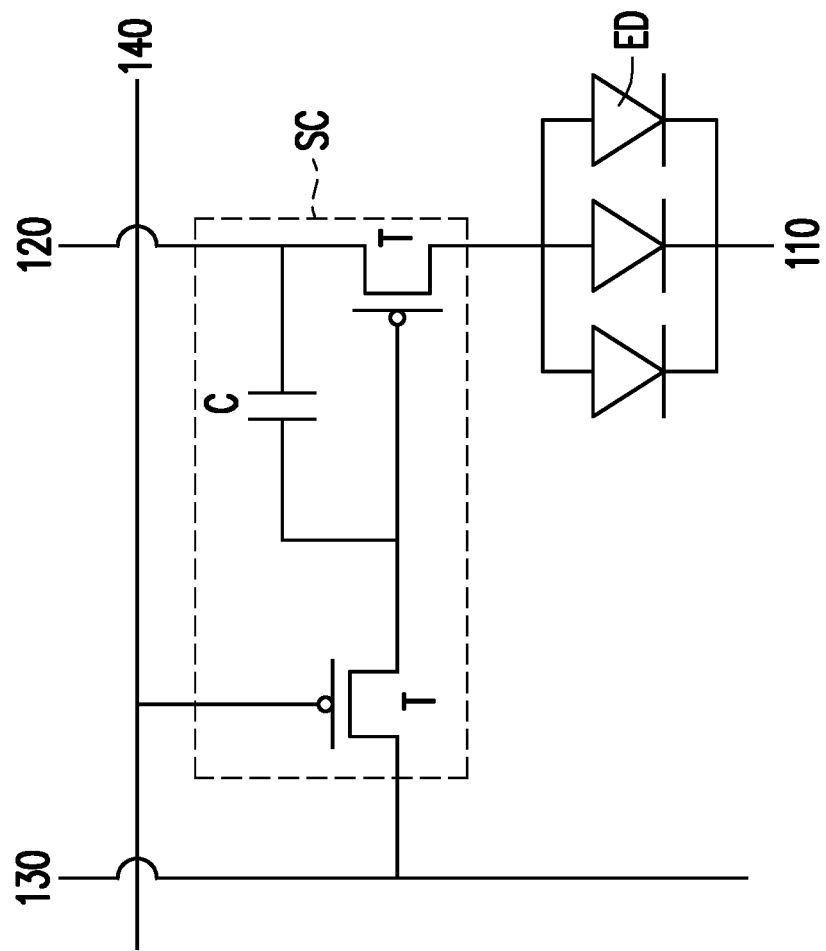
FIG. 5 is a circuit diagram corresponding to a self-luminous light-emitting element according to an embodiment of the present invention.

In other embodiments, the circuit diagram corresponding to each self-luminous light-emitting elements ED is illustrated in FIG. 5. As shown in FIG. 5, each pixel structure may also include a switching circuit consisting one or more active elements T and capacitors C. SC, and the transparent display may further include a third electrode 130 and a fourth electrode 140. The positions of the first electrode 110, the second electrode 120, the third electrode 130, the fourth electrode 140, the active element T, and the capacitor C in the transparent display can be adjusted according to actual needs. In the embodiment of FIG. 5, the transparent display is an actively driven display. In some embodiments, a plurality of self-luminous light-emitting elements ED in the same pixel structure use the same switching circuit SC or the plurality of self-luminous light-emitting elements ED in the same pixel structure use different switching circuits SC. The active element T can be a PMOS transistor or an NMOS transistor.

In this embodiment, a single pixel structure PX includes a plurality of self-luminous light-emitting elements ED connected in parallel, but the invention is not limited thereto. In other embodiments, a single pixel structure PX includes a plurality of self-luminous light-emitting elements ED connected in series (or part of the self-luminous light-emitting elements ED are connected in series and another part of the self-luminous light-emitting elements ED are connected in parallel). In other embodiments, a single pixel structure PX includes self-luminous light-emitting elements ED of different colors that can be independently switched (or the self-luminous light-emitting elements ED have the brightness that can be independently controlled). For example, a single pixel structure PX includes a plurality of switch circuits SC corresponding to the self-luminous light-emitting elements ED of different colors, so that the single pixel structure PX is a color pixel.

Figure 6:
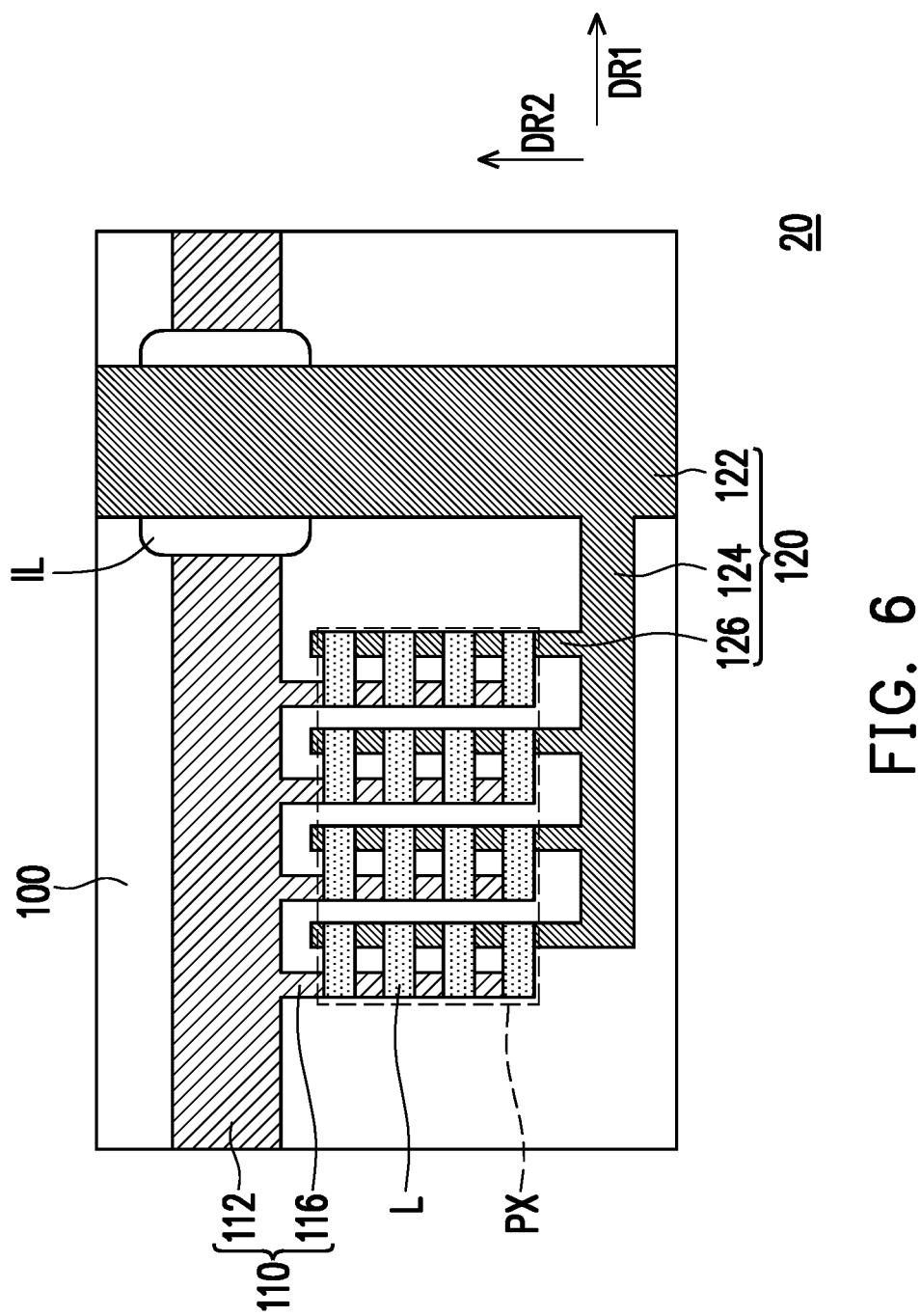
FIG. 6 is a schematic top view of a transparent display according to an embodiment of the invention.

FIG. 6 is a schematic top view of a transparent display according to an embodiment of the invention.

It should be noted that the reference numerals and a part of the contents in the embodiment of FIGS. 2A to 2C are also used to describe the embodiment of FIG. 6, in which the same reference numerals are used to represent identical or similar elements, and thus descriptions of the same technical contents are omitted. The omitted description can refer to the foregoing embodiment, which is not repeated hereinafter.

The difference between the transparent display 20 of FIG. 6 and the transparent display 10 of FIGS. 2A to 2C is that the first electrodes 110 and the second electrodes 120 of the transparent display 20 are formed on the first transparent substrate 100.

Referring to FIG. 6, in this embodiment, the first electrodes 110 and the second electrodes 120 are formed on the first transparent substrate 100, and a plurality of insulation layers IL are sandwiched between the first electrodes 110 and the second electrodes 120.

In this embodiment, the first electrodes 110 and the second electrodes 120 are electrically connected to the pixel structures PX.

In this embodiment, both the first electrodes 110 and the second electrodes 120 are comb-shaped electrodes. The first electrode 110 includes a main portion 112 and branch portions 116, wherein the branch portions 116 are connected to one side of the main portion 112. In this embodiment, the main portion 112 of the first electrode 110 extends along the first direction DR1, and the branch portions 116 extend along the second direction DR2.

The second electrode 120 includes a main portion 122, an extension portion 124 and branch portions 126, wherein the extension portion 124 is connected to one side of the main portion 122, and the branch portions 126 are connected to one side of the extension portion 124. In this embodiment, the main portion 122 of the second electrode 120 extends along the second direction DR2, the extension portion 124 extends along the first direction DR1, and the branch portions 126 extend along the second direction DR2.

The insulation layers IL are located between the main portions 112 of the first electrodes 110 and the main portions 122 of the second electrodes 120. The branch portions 116 of the first electrode 110 and the branch portions 126 of the second electrode 120 are arranged alternately, and each light-emitting element L is electrically connected to a corresponding branch portion 116 and a corresponding branch portion 126.

In this embodiment, a plurality of light-emitting elements L are connected in parallel with each other, but the invention is not limited thereto. In other embodiments, a plurality of light emitting elements L are connected in series with each other. In other embodiments, part of the light-emitting elements L are connected in series, and another part of the light-emitting elements L are connected in parallel.

In some embodiments, the first transparent substrate 100 is further provided with a switch circuit and other electrodes (as shown in FIG. 5) disposed thereon, so that the transparent display 20 becomes an actively driven display, but the present invention is not limited thereto.

Figure 7:
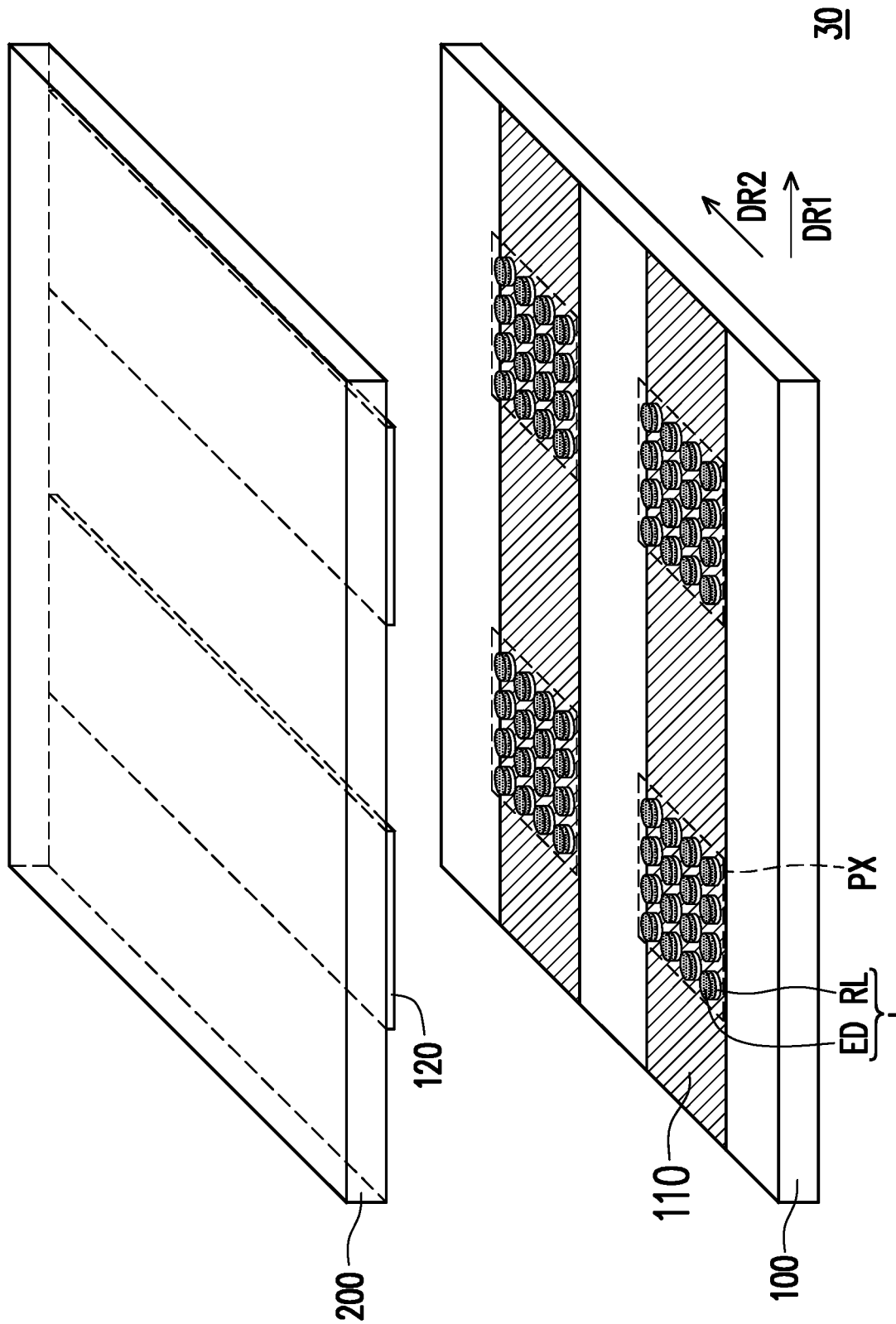
FIG. 7 is a three-dimensional schematic diagram of a transparent display according to an embodiment of the invention.

FIG. 7 is a three-dimensional schematic diagram of a transparent display according to an embodiment of the invention.

It should be noted that the reference numerals and a part of the contents in the embodiment of FIGS. 2A to 2C are also used to describe the embodiment of FIG. 7, in which the same reference numerals are used to represent identical or similar elements, and thus descriptions of the same technical contents are omitted. The omitted description can refer to the foregoing embodiment, which is not repeated hereinafter.

The difference between the transparent display 30 in FIG. 7 and the transparent display 10 in FIG. 2B is that the shape of vertical projection of the light emitting element L in each pixel structure PX on the transparent substrate 100 of the transparent display 30 is a circle. For example, the light-shielding layer RL of the light-emitting element L is a circle and/or the self-luminous light-emitting element ED of the light-emitting element L is a circle.

Figure 8:
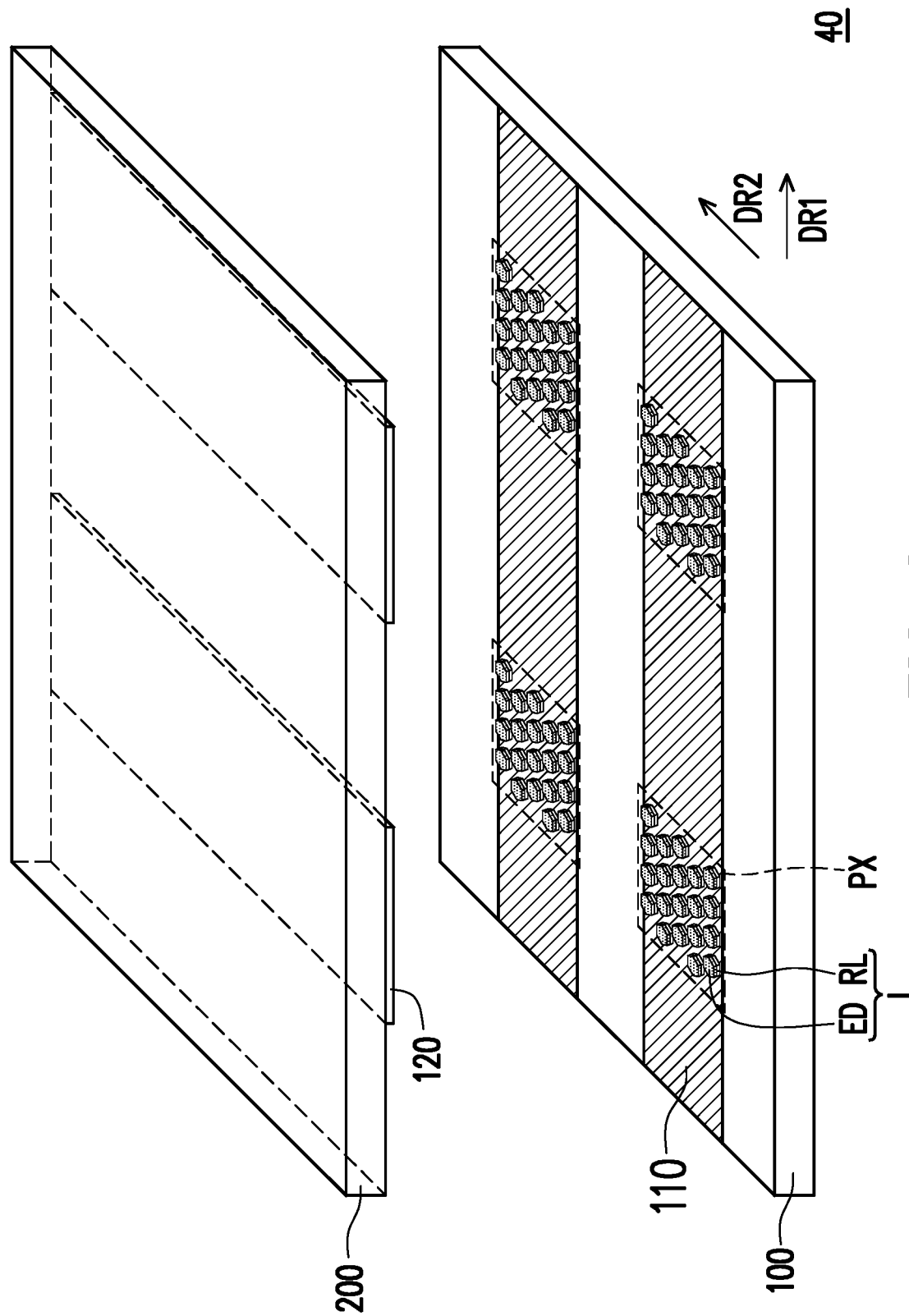
FIG. 8 is a three-dimensional schematic diagram of a transparent display according to an embodiment of the present invention.

FIG. 8 is a three-dimensional schematic diagram of a transparent display according to an embodiment of the present invention.

It should be noted that the reference numerals and a part of the contents in the embodiment of FIGS. 2A to 2C are also used to describe the embodiment of FIG. 8, in which the same reference numerals are used to represent identical or similar elements, and thus descriptions of the same technical contents are omitted. The omitted description can refer to the foregoing embodiment, which is not repeated hereinafter.

The difference between the transparent display 40 of FIG. 8 and the transparent display 10 of FIG. 2B is that the shape of vertical projection of the light emitting element L in each pixel structure PX on the transparent substrate 100 of the transparent display 40 is a hexagon. For example, the light-shielding layer RL of the light-emitting element L is a hexagon and/or the self-luminous light-emitting element ED of the light-emitting element L is a hexagon.

Figure 9:
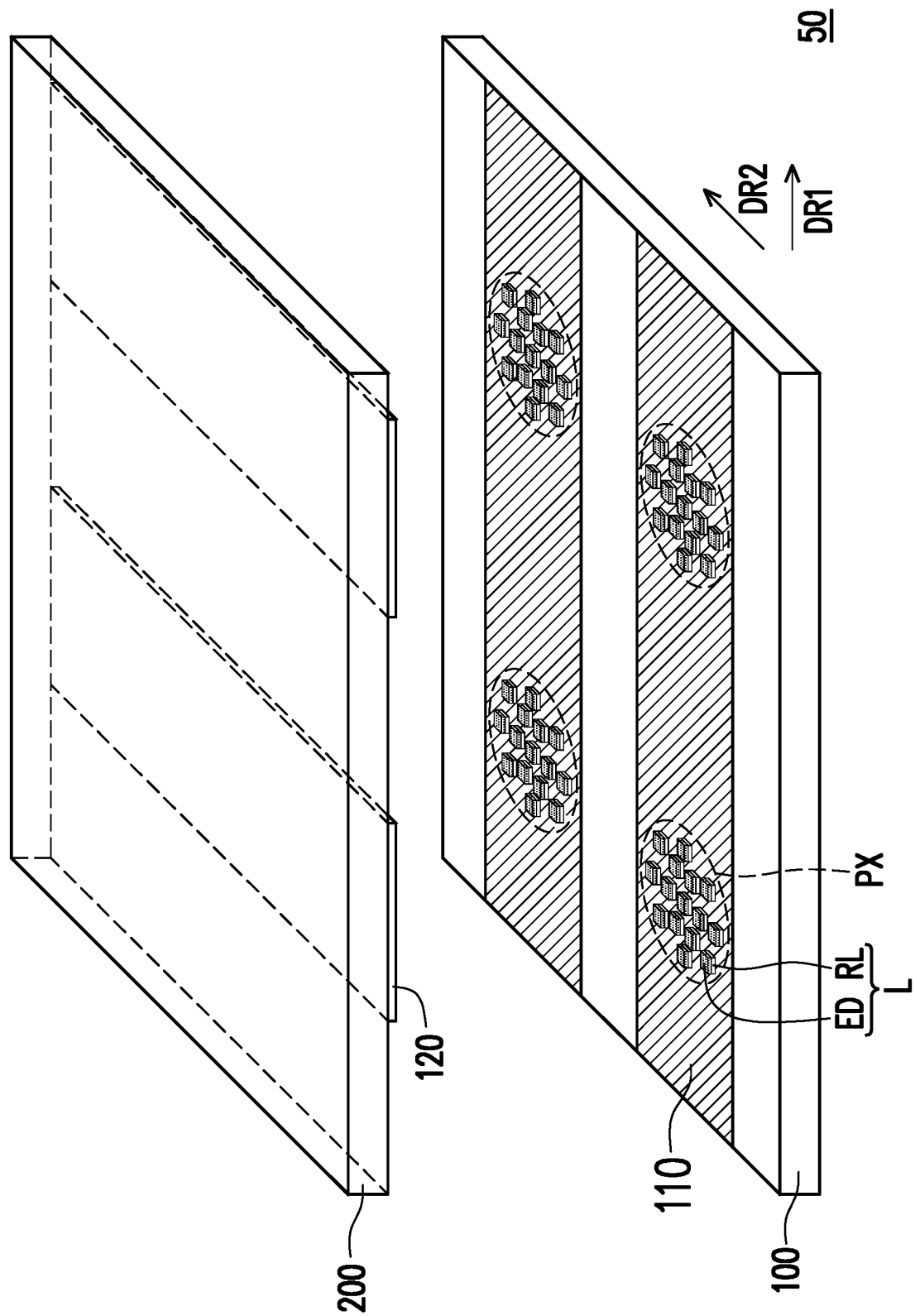
FIG. 9 is a three-dimensional schematic diagram of a transparent display according to an embodiment of the present invention.

FIG. 9 is a three-dimensional schematic diagram of a transparent display according to an embodiment of the present invention.

It should be noted that the reference numerals and a part of the contents in the embodiment of FIGS. 2A to 2C are also used to describe the embodiment of FIG. 9, in which the same reference numerals are used to represent identical or similar elements, and thus descriptions of the same technical contents are omitted. The omitted description can refer to the foregoing embodiment, which is not repeated hereinafter.

The difference between the transparent display 50 in FIG. 9 and the transparent display 10 in FIG. 2B is that at least part of the light-emitting elements L in the pixel structure PX of the transparent display 50 are arranged in a staggered rectangle array. For example, the distribution of the light-emitting elements L is a radial distribution. In other word, the light-emitting elements L are arranged in a concentric array.

Figure 10:
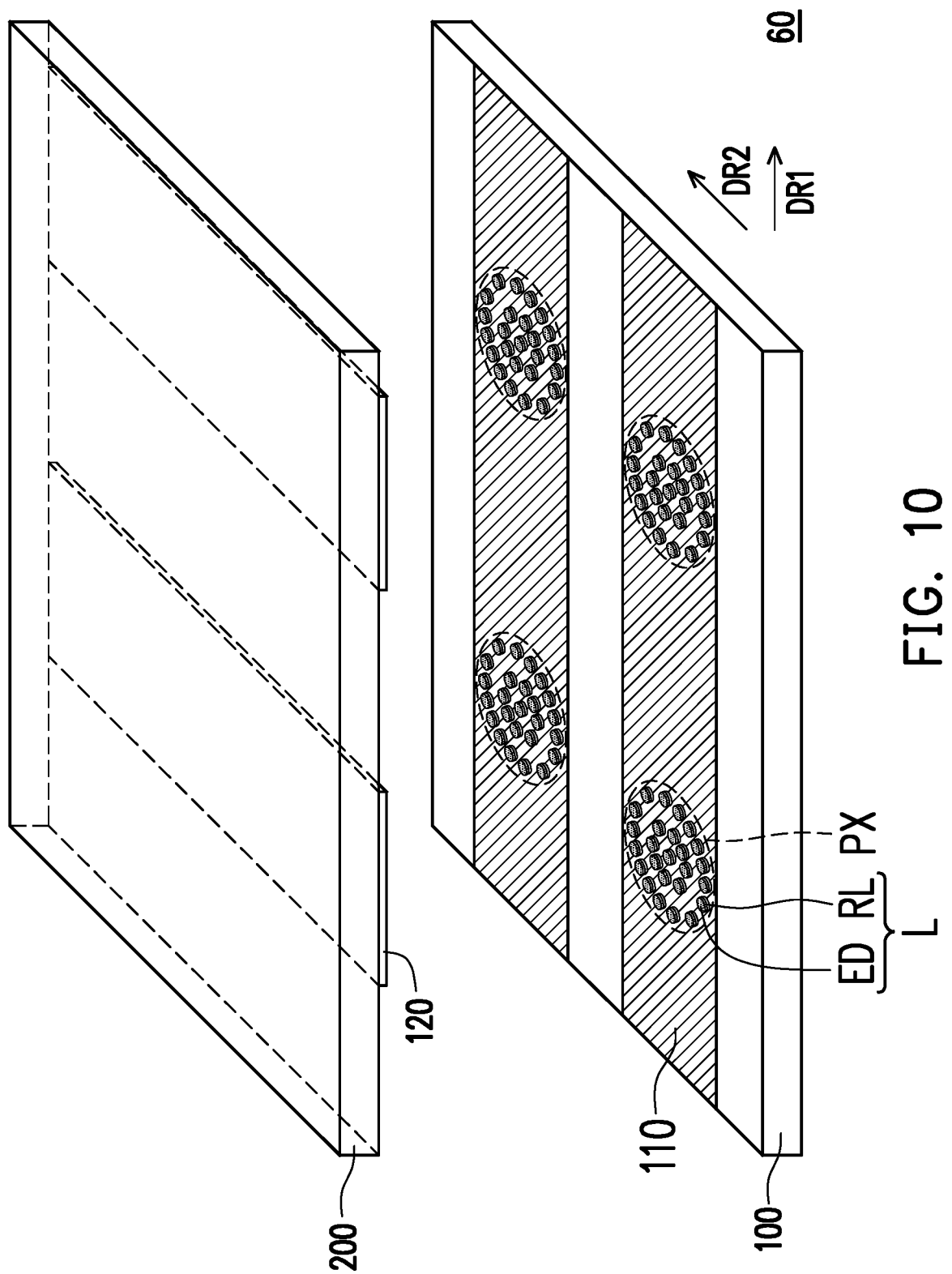
FIG. 10 is a three-dimensional schematic diagram of a transparent display according to an embodiment of the present invention.

FIG. 10 is a three-dimensional schematic diagram of a transparent display according to an embodiment of the present invention.

It should be noted that the reference numerals and a part of the contents in the embodiment of FIG. 7 are also used to describe the embodiment of FIG. 10, in which the same reference numerals are used to represent identical or similar elements, and thus descriptions of the same technical contents are omitted. The omitted description can refer to the foregoing embodiment, which is not repeated hereinafter.

The difference between the transparent display 60 of FIG. 10 and the transparent display 30 of FIG. 7 is that at least part of the light-emitting elements L in the pixel structure PX of the transparent display 60 are arranged in a staggered circle array. For example, the distribution of the light-emitting elements L is a radial distribution. In other word, the light-emitting elements L are arranged in a concentric array.

Figure 11:
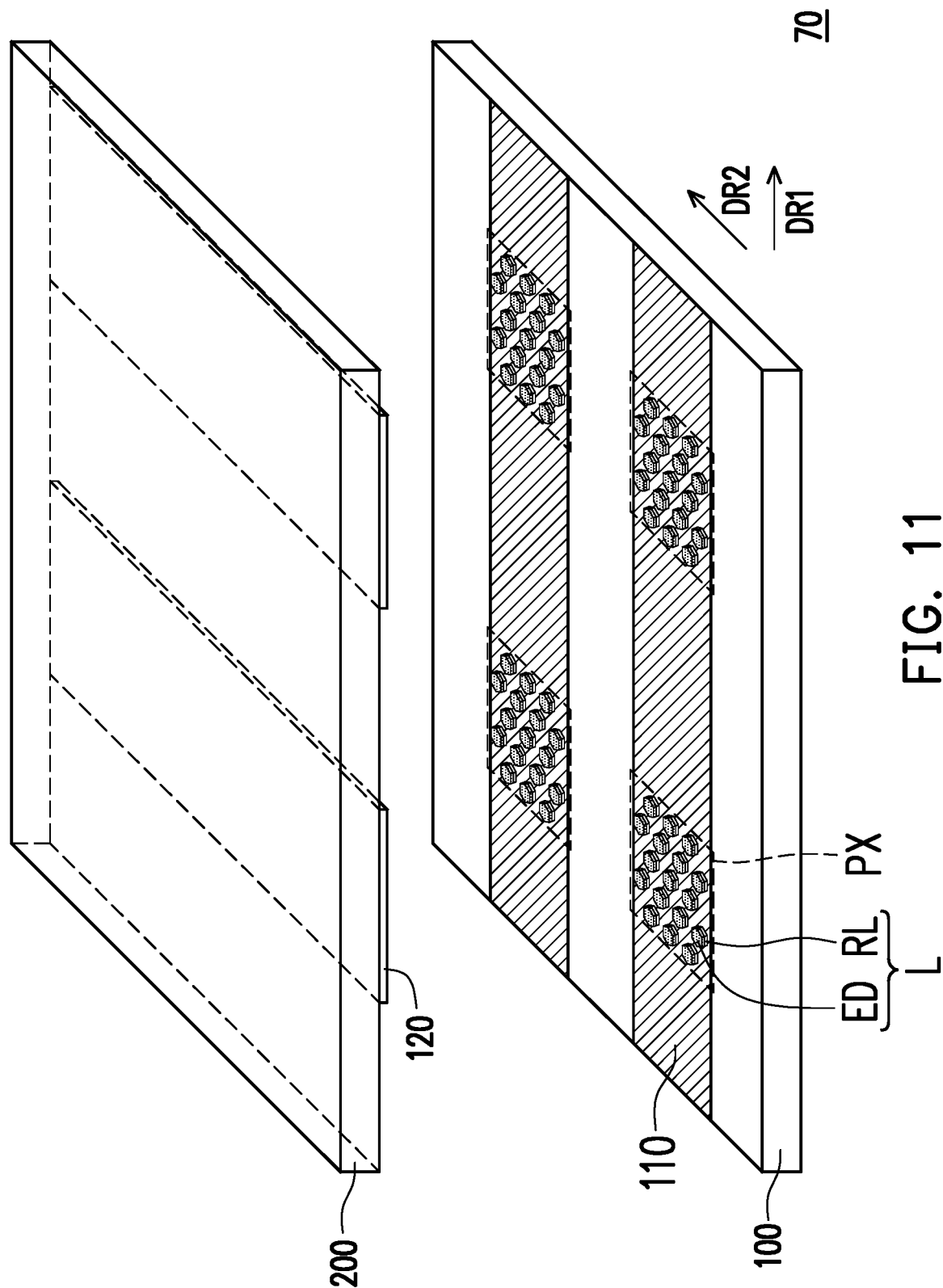
FIG. 11 is a three-dimensional schematic diagram of a transparent display according to an embodiment of the present invention.

FIG. 11 is a three-dimensional schematic diagram of a transparent display according to an embodiment of the present invention.

It should be noted that the reference numerals and a part of the contents in the embodiment of FIG. 8 are also used to describe the embodiment of FIG. 11, in which the same reference numerals are used to represent identical or similar elements, and thus descriptions of the same technical contents are omitted. The omitted description can refer to the foregoing embodiment, which is not repeated hereinafter.

The difference between the transparent display 70 in FIG. 11 and the transparent display 40 in FIG. 8 is that at least part of the light-emitting elements L in the pixel structure PX of the transparent display 70 are arranged in a staggered circle array. For example, the distribution of the light-emitting elements L is a radial distribution. For example, part of the light-emitting elements L is arranged along the second direction DR2, and another part of the light-emitting elements L is arranged along the first direction DR1, and the light-emitting elements L has a staggered arrangement.

Figure 12:
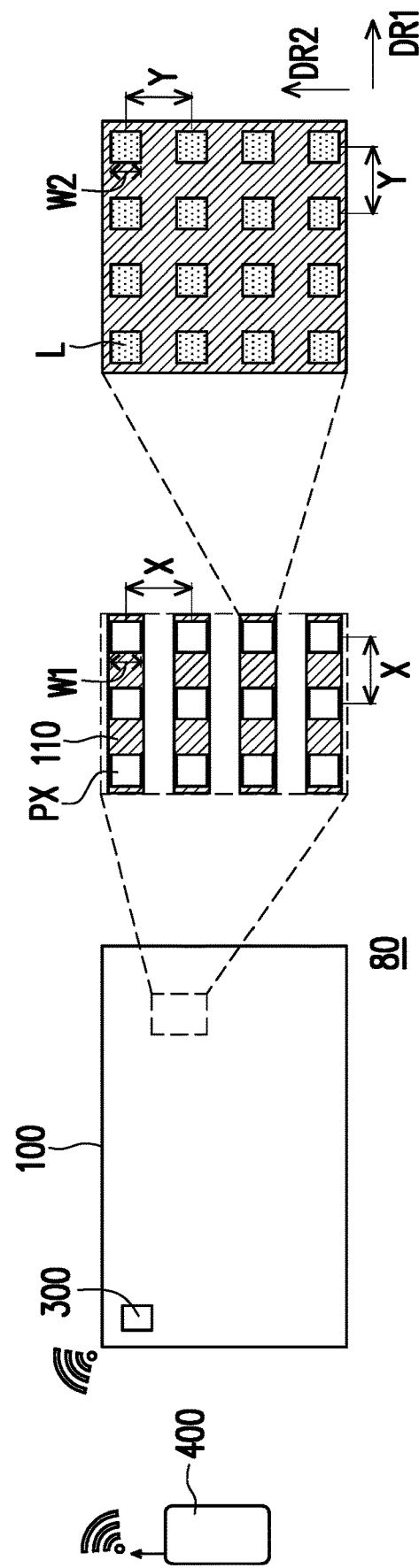
FIG. 12 is a schematic top view of a transparent display according to an embodiment of the invention.

FIG. 12 is a schematic top view of a transparent display according to an embodiment of the invention.

It should be noted that the reference numerals and a part of the contents in the embodiment of FIGS. 2A to 2C are also used to describe the embodiment of FIG. 12, in which the same reference numerals are used to represent identical or similar elements, and thus descriptions of the same technical contents are omitted. The omitted description can refer to the foregoing embodiment, which is not repeated hereinafter.

The difference between the transparent display 80 in FIG. 12 and the transparent display 10 in FIG. 2A is that the transparent display 80 further includes a receiver 300.

The receiver 300 is disposed on the first transparent substrate 100 and is suitable for been matched with the controller 400. The receiver 300 is electrically connected to the pixel structures PX. For example, the receiver 300 is electrically connected to the pixel structures PX through the first electrodes 110, the second electrodes (not shown in FIG. 12), and/or other electrodes (not shown in FIG. 12).

The receiver 300 is, for example, an antenna receiver, an infrared receiver, a bluetooth receiver, or a microwave receiver. In some embodiments, the receiver 300 includes, for example, an opaque conductive material (such as metal material), and is disposed in the non-display area (or frame area) of the transparent display 80. In some embodiments, the receiver 300 includes, for example, a transparent conductive material, and is disposed in a display area or a non-display area of the transparent display 80.

The controller 400 is, for example, a mobile phone, a remote controller, or other remote controller devices. The controller 400 transmits information to the transparent display 80 through a wireless method (such as Wi-Fi, Bluetooth, and other wireless transmission protocols). In some embodiments, the information to be displayed is preset in the controller 400, and then the controller 400 is operated by means of virtual keys or voice recognition, and the information to be displayed is wirelessly transmitted to the receiver 300 of the transparent display 80.

What is claimed is:

1. A transparent display, comprising:
a first transparent substrate;
a plurality of pixel structures, located on the first transparent substrate, wherein each of the plurality of pixel structures comprises three or more of light-emitting elements, and the three or more of light-emitting elements are emitting a same color in one of the plurality of pixel structures, wherein a pitch between adjacent light-emitting elements in each of the pixel structures is 0.17 mm to 0.34 mm, and the pitch between adjacent pixel structures is 3.4 mm to 15.4 mm;
a plurality of first electrodes, electrically connected to the plurality of pixel structures; and
a plurality of second electrodes, electrically connected to the plurality of pixel structures, wherein the three or more of light-emitting elements in the one of the plurality of pixel structures are arranged in an array, wherein anodes of the three or more light-emitting elements in the one of the plurality of pixel structures are directly connected to one of the plurality of first electrodes, and cathodes of the three or more light-emitting elements in the one of the plurality of pixel structures are directly connected to one of the plurality of second electrodes.

2. The transparent display of claim 1, wherein each of the three or more of light-emitting elements comprises:
a light-shielding layer, wherein a width of the light shielding layer is equal to or less than half of the pitch between the adjacent light-emitting elements, and a width of each of the plurality of pixel structures is equal to or greater than half of the pitch between the adjacent pixel structures; and
a self-luminous light-emitting element, disposed on the light-shielding layer.

3. The transparent display of claim 1, further comprises:
a second transparent substrate, disposed opposite to the first transparent substrate, wherein the plurality of first electrodes are formed on the first transparent substrate, and the plurality of second electrodes are formed on the second transparent substrate.

4. The transparent display of claim 1, wherein the plurality of first electrodes and the plurality of second electrodes are formed on the first transparent substrate, and a plurality of insulation layers are sandwiched between the plurality of first electrodes and the plurality of second electrodes.

5. The transparent display of claim 1, wherein:
the plurality of pixel structures are arranged in a rectangular array, and light-emitting elements of pixel structures located in a same column are electrically connected to a same first electrode, and light-emitting elements of pixel structures located in a same row are electrically connected to a same second electrode.

6. The transparent display of claim 1, wherein at least part of the three or more of light-emitting elements in each of the plurality of pixel structures are arranged in a staggered rectangle array.

7. The transparent display of claim 1, wherein the three or more of light-emitting elements in each of the plurality of pixel structures are arranged in a concentric array.

8. The transparent display of claim 1, wherein shapes of a vertical projection of the plurality of light emitting elements on the first transparent substrate are circles, rectangles, or hexagons.

9. The transparent display of claim 1, further comprises:
a receiver, disposed on the first transparent substrate, wherein the receiver is suitable for being matched with a controller, wherein the receiver is electrically connected to the plurality of pixel structures.

10. The transparent display of claim 9, wherein the receiver is an antenna receiver, an infrared receiver, a Bluetooth receiver, or a microwave receiver.

11. The transparent display of claim 1, wherein materials of the plurality of first electrodes and the plurality of second electrodes comprise transparent conductive materials.

12. A transparent display suitable for a rear windshield of a transportation device, comprising:
a first transparent substrate disposed on a rear windshield of a front vehicle;
a plurality of pixel structures, located on the first transparent substrate, wherein each of the plurality of pixel structures comprises three or more of light-emitting elements, wherein the three or more of light-emitting elements are emitting a same color in one of the plurality of pixel structures;

a plurality of first electrodes, electrically connected to the plurality of pixel structures; and a plurality of second electrodes, electrically connected to the plurality of pixel structures, wherein a sum of a sight distance between a first driver in the front vehicle and an interior rearview mirror located in the front vehicle and a distance between the interior rearview mirror and the first transparent substrate is about 2 meters to 3 meters, wherein a sight distance between the first transparent substrate disposed on the rear windshield of the front vehicle and a second driver in a rear vehicle is about 20 meters to 90 meters, wherein the first transparent substrate and the rear windshield of the front vehicle are located between the first driver and the second driver, and wherein a pitch between adjacent light-emitting elements in each of the plurality of pixel structures is 0.17 mm to 0.34 mm, and a pitch between adjacent pixel structures is 3.4 mm to 15.4 mm, wherein the three or more light-emitting elements in the one of the plurality of pixel structures are arranged in an array, wherein anodes of the three or more light-emitting elements in the one of the plurality of pixel structures are directly connected to one of the plurality of first electrodes, and cathodes of the three or more light-emitting elements in the one of the plurality of pixel structures are directly connected to one of the plurality of second electrodes.

13. The transparent display of claim 12, further comprises:

a second transparent substrate, disposed opposite to the first transparent substrate, wherein the plurality of first electrodes are formed on the first transparent substrate, and the plurality of second electrodes are formed on the second transparent substrate.

14. The transparent display of claim 12, wherein the plurality of first electrodes and the plurality of second electrodes are formed on the first transparent substrate, and a plurality of insulating layers are sandwiched between the plurality of first electrodes and the plurality of second electrodes.

15. The transparent display of claim 12, wherein:

the plurality of pixel structures are arranged in a rectangular array, and light-emitting elements of pixel structures located in a same column are electrically connected to a same first electrode, and light-emitting elements of pixel structures located in a same row are electrically connected to a same second electrode.

16. The transparent display of claim 12, wherein at least part of the three or more of light-emitting elements in each of the plurality of pixel structures are arranged in a staggered rectangle array.

17. The transparent display of claim 12, wherein the three or more of light-emitting elements in each of the plurality of pixel structures are arranged in a concentric array.

18. The transparent display of claim 12, wherein shapes of a vertical projection of the plurality of light emitting elements on the first transparent substrate are circles, rectangles, or hexagons.

19. The transparent display of claim 12, further comprises:

a receiver, disposed on the first transparent substrate, wherein the receiver is suitable for being matched with a controller, wherein the receiver is an antenna receiver, an infrared receiver, a Bluetooth receiver, or a microwave receiver.

20. The transparent display of claim 12, wherein materials of the plurality of first electrodes and the plurality of second electrodes comprise transparent conductive materials, and the three or more of light-emitting elements comprise self-luminous light-emitting elements.

* * * * *